United States Patent [19]

Etzold

[11] 4,181,864

[45] Jan. 1, 1980

[54] MATCHING NETWORK FOR SWITCHABLE SEGMENTED ULTRASONIC TRANSDUCERS

[75] Inventor: Karl-Friedrich Etzold, New York, N.Y.

[73] Assignee: RCA Corporation, New York, N.Y.

[21] Appl. No.: 917,890

[22] Filed: Jun. 22, 1978

[51] Int. Cl.$^2$ ............................................ H01L 41/10

[52] U.S. Cl. .................................... 310/314; 310/316; 310/317; 310/319; 310/366

[58] Field of Search ............... 310/314, 316, 317, 319, 310/366

[56] References Cited

U.S. PATENT DOCUMENTS

| | | | |
|---|---|---|---|
| 1,766,045 | 6/1930 | Nicolson | 310/319 X |
| 2,834,158 | 5/1958 | Petermann | 310/317 X |
| 3,947,708 | 3/1976 | Fulenwider | 310/366 X |
| 3,978,353 | 8/1976 | Kinoshita | 310/317 |
| 4,096,756 | 6/1978 | Alphonse | 310/317 X |

*Primary Examiner*—Mark O. Budd

*Attorney, Agent, or Firm*—Samuel Cohen; George J. Seligsohn

[57] ABSTRACT

Special low inductance switchable coupling means are provided to permit selective matching of the various segments of the ultrasonic transducer.

2 Claims, 7 Drawing Figures

PRIOR ART

MATCHING NETWORK FOR SWITCHABLE SEGMENTED ULTRASONIC TRANSDUCERS

Figure 1A:
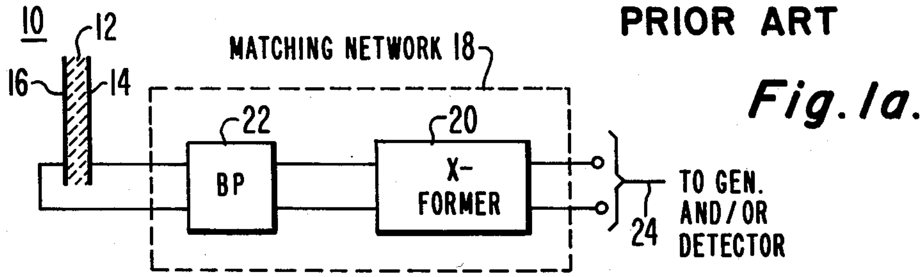

This invention relates to matching networks for ultrasonic transducers and, more particularly, to such matching networks for segmented transducers.

It is known that a piezoelectric plate with its faces metalized forms a three-port device. The three-ports comprise one electrical port, between the respective electrodes formed by the two metalized surfaces, across which a voltage can exist, and two mechanical ports, consisting of each of the respective faces of the plate, over which a force can exist. The impedance of the electrical port depends upon the boundary conditions at the two faces of the transducer. Either of the two mechanical ports is in the open-circuit condition when the corresponding piezoelectric plate is placed against a "rigid" wall (i.e. a wall having a very high acoustic impedance) and is in the short-circuit condition when it is in a vacuum or when it is in contact with a very low acoustic impedance, such as air. When an ultrasonic transducer is used conventionally for generating or receiving acoustic wave energy within a given operating frequency bandwidth, the thickness of the piezoelectric plate is usually selected to resonate at the mid-frequency of the given operating frequency bandwidth. Further, the operating face or faces of the transducer are normally in contact with an ultrasonic wave propagating medium, such as water, exhibiting an acoustic impedance intermediate that of the open-circuit condition and that of the short-circuit condition. It is usually desirable that this acoustic impedance be matched with the electrical impedance exhibited by an electrical generator (source) and/or detector coupled to the electrodes of the transducer. In order to accomplish this a matching network must be inserted between the electrical generator and/or detector and the electrodes of the ultrasonic transducer.

Reference is made to copending U.S. patent application Ser. No. 844,140, filed Oct. 20, 1977 by Mezrich now U.S. Pat. No. 4,138,895 issued Feb. 13, 1979, and assigned to the same assignee as the present application. This copending patent application discloses a segmented ultrasonic transducer unit comprising a center section, which cooperates with only a small portion of the relatively large aperture of an acoustic lens, and an annular section, which cooperates with the remainder of the aperture. By selectively operating a switching means, the unit can utilize the relatively large depth of focus of the central section alone or alternatively, utilize the relatively small depth of focus of both the central and annular sections together.

The present invention is directed to a practical technique for impedance matching a switchable segmented transducer unit as, for example, the one of the copending applications.

Figure 1B:
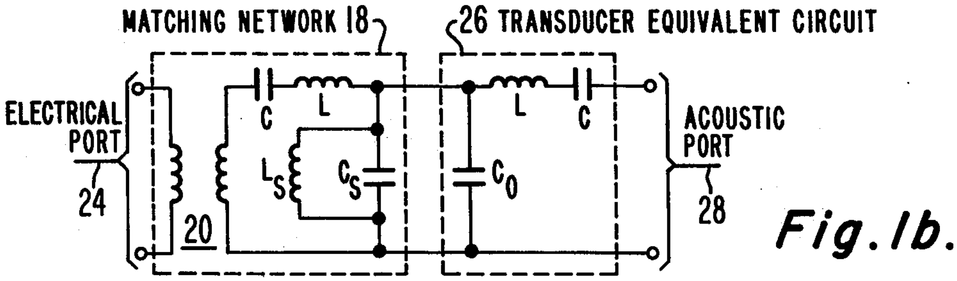
Figure 2:
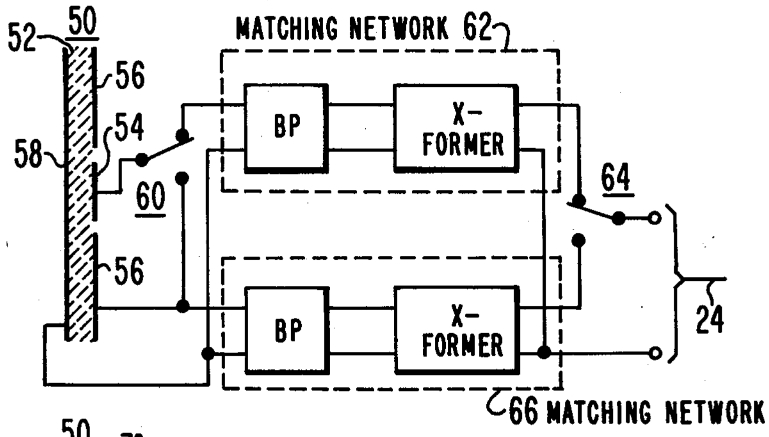
Figure 3:
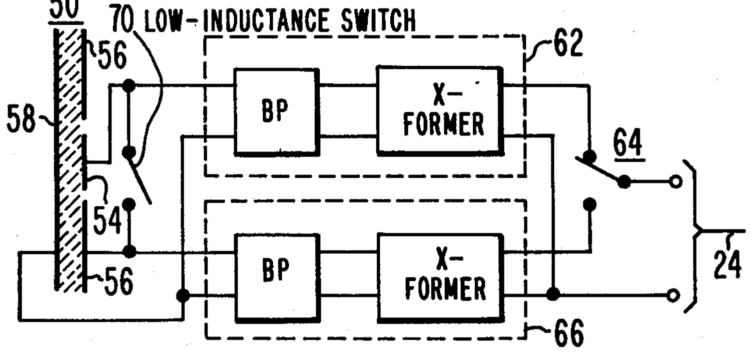
Figure 3A:
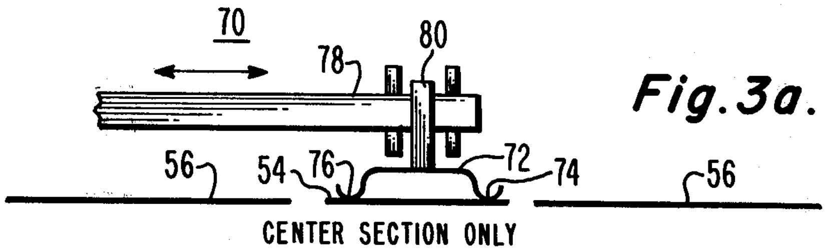
Figure 3B:
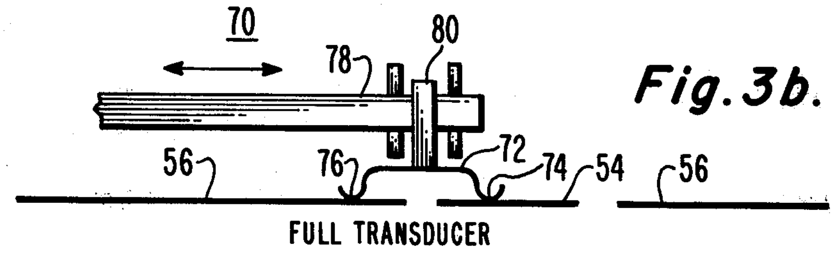

IN THE DRAWINGS:

FIG. 1*a* is a block diagram illustrating a typical prior art matching network coupled to the electrodes of a piezoelectric transducer unit and FIG. 1*b* is an electrical equivalent circuit of the transducer and matching network;

FIG. 2 is a block diagram of a straight-forward combination of a switchable segmented transducing unit with matching networks;

FIGS. 3, 3*a*, and 3*b* illustrate one embodiment of the present invention, and

Figure 4:
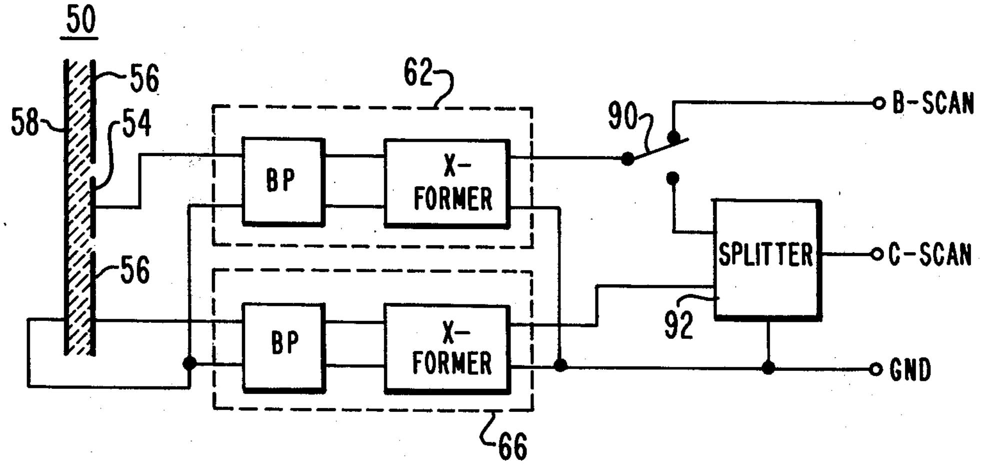

FIG. 4 illustrates another embodiment of the present invention.

Referring to FIG. 1*a*, a conventional transducer unit 10 comprises a piezoelectric plate 12 of a given thickness having its opposite faces covered by electrodes 14 and 16. The matching network 18, comprises a transformer 20 and a band-pass filter (BP) 22 that matches the complex impedance of transducer unit 10 to that of an electrical generator and/or detector coupled to the electrical port output 24 of matching network 18.

FIG. 1*b* shows the electrical equivalent circuit 26 of transducer unit 10. Circuit 26 comprises a L-C series resonant portion (having a resonant frequency determined by the thickness of the piezoelectric medium (12) and a shunt capacitance $C_O$ (the static part of the capacitance between electrodes 14 and 16 which is sometimes termed the "clamped" capacitance). The acoustic port output 28 is coupled to the acoustic impedance of the medium (such as water) to which transducer unit 10 is coupled. The band-pass portion of matching network 18 includes an identical (lumped), L-C series-resonant section and a parallel section composed of inductance $L_s$ and capacitance $C_s$. The respective values of $L_s$ and $C_s$ are such that together with capacitance $C_O$ they form a parallel resonant section at the resonant frequency of transducer unit 10 and such that this parallel resonant section has a Q which provides an electrical bandwidth equal to the mechanical bandwidth of transducer unit 10. The elements of matching network 18, including capacitance C, inductance L, inductance $L_s$ and capacitance $C_s$, comprise the band-pass filter 22 of FIG. 1*a*. Transformer 20, besides providing electrical isolation, may have a turns ratio for transforming the electrical impedance of the output of band-pass filter 22 to a more convenient value. If desired, transformer 20 may be situated between the terminals of transducer unit 10 and band-pass filter 22, rather than between band-pass filter 22 and the electrical port 24 as shown in FIGS. 1*a* and 1*b*.

Referring to FIG. 2, a switchable segmented transducer unit 50 is shown comprising a piezoelectric plate 52 having a given thickness and having its opposite faces covered by electrodes 54, 56 and 58. Specifically, electrode 54 covers a central section of one face of piezoelectric medium 52; annular electrode 56 surrounding electrode 54 covers substantially the remainder of this face of piezoelectric medium 52 and common electrode 58 covers the other face of piezoelectric medium 52.

In operation, it is desired to selectively employ either all of transducer unit 50 (central electrode 54 and annular electrode 56 in parallel) or only the central section of transducer unit 50 i.e. solely central electrode 54. The technique of FIG. 2 attempts, in a straightforward way, to provide matching for such a switchable, segmented transducer. In particular, in a first switch position of double-throw switches 60 and 64, the first matching network 62 is inserted between solely center electrode 54 and the ultrasonic pulse source and/or detector. The impedance characteristics of matching network 62 are selected to match only the central section of transducer 50 to the ultrasonic pulse source and/or detector. In a second switch position of double-throw switches 60 and 64 the second matching network 66 is inserted between both center and annular electrodes 54 and 56 and the ultrasonic pulse source and/or detector. The characteristic of matching network 66 is selected to match the entirety of transducer unit 50 to the ultrasonic pulse source and/or detector.

The difficulty with this is a very appreciable inductance of the leads and switch 60 on the transducers side of the matching network. When the entire area of transducer unit 50 is employed (switches 60 and 64 in their second switch position), the inductance introduced by the presence of switch 60 is sufficient to series resonate with the shunt (clamped) capacitance ($C_O$ in FIG. 1*b*) of transducer unit 50 at a frequency within the operating bandwidth of transducer unit 50. By way of example, the shunt capacitance of a four inch diameter transducer is about 0.042 $\mu$F. An inductance of only 0.27 $\mu$H is sufficient to series resonate with this capacitance at the operating frequency of 1.5 MHz.

FIGS. 3, 3*a* and 3*b* illustrate the first embodiment of the present invention, in which a special single-throw low-inductance switch 70 replaces double-throw switch 60 of FIG. 2. Specifically, as shown in FIG. 3, low-inductance switch 70 selectively connects center electrode 54 to annular electrode 56. In all other respects, the arrangement of FIG. 3 is identical to that of FIG. 2.

The mechanical details of low-inductance switch 70 are shown in FIGS. 3*a* and 3*b*. Particularly, switch 70 comprises a slideable electrically-conducting member 72 including first and second spaced contacts 74 and 76. Actuating arm 78 and post 80 comprise means for situating member 72 so that both first and second contacts 74 and 76 engage only center electrode 54 in a first switch position of switch 70 (FIG. 3*a*) or for alternatively situating member 72 so that first contact 74 engages center electrode 54 and second contact 76 engages annular electrode 56 in a second switch position (FIG. 3*b*).

When switches 70 and 64 both are in the first switch position, solely the center electrode 54 is coupled through matching network 62 to the electrical port 24. when switches 70 and 64 both are in their second switch position, both center and annular electrodes 54 and 56, respectively, are connected through matching network 66 to the electrical port 24. Because the connections to electrodes 54 and 56 are permanent, rather than switchable, they may be made to have a low inductance. By way of example, center electrode 54 may have a diameter of one inch and annular electrode 56 may have an outer diameter of four inches; therefore, when switch 70 is in its first switch position, the effective area of transducer 50 is only one inch. However, when switch 70 is in its second position, the effective area of transducer unit 50 is four inches. It is permissible to leave matching network 62 connected to center electrode 54 even when switch 70 is in its second position because matching network 62 is of relatively high impedance (it matches a small area) and is of low loss. The resulting simpler switching using single-throw switch 70 (rather than double-throw switch 60 FIG. 2) allows switch 70 to be mounted near the transducer in a manner that electrodes 54 and 56 of transducer unit 50 are part of the switch having very low inductance by virtue of the very short effective length which can be obtained with such a configuration (FIGS. 3*a* and 3*b*). This feature is not available with a separate SPDT switch, such as switch 60 of FIG. 2. Therefore, the arrangement of FIGS. 3, 3*a* and 3*b* prevent the introduction of an inductance sufficient to series-resonate with the shunt capacitance of transducer unit 50.

FIG. 4 shows a second embodiment of this invention. Specifically, center electrode 54 is connected directly to one end of matching network 62 and annular electrode 56 is connected directly to one end of matching network 66. Thus, no switch at all is inserted between transducer unit 50 and matching networks 62 and 66. However, the other end of matching network 62 is selectively connected in a first switch position of double-throw switch 90 to a B-scan terminal or in a second switch position of switch 90 to a first terminal of power splitter 92. The other end of matching network 66 is connected to a second terminal of power splitter 92. A C-scan terminal is connected to a third terminal of power splitter 92. Power splitter 92 splits the power supplied to the third terminal thereof between its first and second terminal in the same proportion as that of the respective areas of center electrode 54 and annular electrode 56. The ultrasonic generator and/or detector with a matching electrical impedance for a B-scan display is connected between the B-scan terminal and ground, while an ultrasonic generator and/or detector, also with a matching electrical impedance, for a C-scan display is connected between the C-scan terminal and ground. Use of the power splitter 92 ensures that the amplitude over the entire surface of ultrasonic transducer 50 is uniform, so that the segmented transducing unit 50 is substantially indistinguishable from an unsegmented one, when the full aperture of transducer 50 is employed (switch 90 in the second switch position). In the second embodiment, shown in FIG. 4, it is an important requirement that care be taken in the design of matching network 62 and 66 so that the phase relationship, at center electrode 54 and annular electrode 56, respectively, is the same as the phase relationship as the first and second terminals of power splitter 92.

In the preferred embodiments of the present invention, the segmented transducing unit comprises a center electrode surrounded by an angular electrode, but the benefit of the present invention may be applied to any type of segmented transducer unit regardless of its particular topography, so long as the segments can be physically connected by a switch similar to switch 70.

What is claimed is:

1. In combination:

(a) an ultrasonic transducer unit having a given operating frequency bandwidth, said transducer unit including a piezoelectric medium having a common electrode on one side thereof and segmented first and second electrodes on the other side thereof, a first area of said transducer unit defined by said first electrode and said common electrode exhibiting a first clamped capacitance and first acoustic impedance over said given operating frequency bandwidth and a second area of said transducer unit defined by said second electrode and said common electrode exhibiting a second clamped capacitance and a second acoustic impedance over said given operating bandwidth, (b) a first matching network effective for matching solely said first acoustic impedance to a predetermined electrical impedance over said given frequency operating bandwidth only when said first matching network is coupled therebetween, (c) a second matching network for matching said first and second acoustic impedances in parallel to said predetermined electrical impedance over said given frequency operating bandwidth only when said second matching network is coupled therebetween, and (d) switchable coupling means for selectively rendering effective said first matching network, or, alternatively, said second matching network without ever introducing an inductance sufficient to resonate with or total capacitance equal to the sum of said first and second clamped capacitances at a frequency within said operating frequency bandwidth;

wherein said segmented first and second electrodes comprise a center-electrode surrounded by an annular electrode, said first area of said transducer unit exhibiting a relatively small first clamped capacitance and a relatively high first acoustic impedance over said given operating frequency bandwidth compared to the respective sizes of said second capacitance and second acoustic impedance of said second area;

wherein said switchable coupling means includes first coupling means connecting said center electrode solely to one end of said first matching network, second coupling means connecting said annular electrode solely to one end of said second matching network, a low-inductance slidable first switch for selectively bridging said center and annular electrodes, and a double-throw second switch for selectively connecting solely the other end of either the first matching network or alternatively the second matching network to said predetermined electrical impedance, and wherein said first switch comprises a slidable electrically-conducting member including first and second spaced contacts, said first switch further including means for situating said member so that both said first and second contacts engage said first switch or for alternatively situating said member so that said first contacts engage said center electrode and said second contacts engage said annular electrode in a second switch position of said first switch.

2. In combination:

(a) an ultrasonic transducer unit having a given operating frequency bandwidth, said transducer unit including a piezoelectric medium having a common electrode on one side thereof and segmented first and second electrodes on the other side thereof, a first area of said transducer unit defined by said first electrode and said common electrode exhibiting a first clamped capacitance and first acoustic impedance over said given operating frequency bandwidth and a second area of said transducer unit defined by said second electrode and said common electrode exhibiting a second clamped capacitance and a second acoustic impedance over said given operating bandwidth, (b) a first matching network effective for matching solely said first acoustic impedance to a predetermined electrical impedance over said given frequency operating bandwidth only when said first matching network is coupled therebetween, (c) a second matching network for matching said first and second acoustic impedances in parallel to said predetermined electrical impedance over said given frequency operating bandwidth only when said second matching network is coupled therebetween, and (d) switchable coupling means for selectively rendering effective said first matching network, or, alternatively, said second matching network without ever introducing an inductance equal to the sum of said first and second clamped capacitances at a frequency within said operating frequency bandwidth;

wherein said segmented first and second electrodes comprise a center-electrode surrounded by an annular electrode, said first area of said transducer unit exhibiting a relatively small first clamped capacitance and a relatively high first acoustic impedance over said given operating frequency bandwidth compared to the respective sizes of said second capacitance and second acoustic impedance of said second area, and wherein said center electrode is coupled solely to one end of said first matching network and wherein said second matching network comprises both said first matching network and a third matching network, said annular electrode being connected to one end of said third matching network, and wherein said switchable coupling means comprises a splitter having first, second and third terminals for splitting electrical power at said third terminal thereof between said first and second terminals thereof in the same proportion as that of the respective sizes of said first and second areas of said transducer, a double-throw switch for selectively connecting the other end of said first matching network to said predetermined electrical impedance in a first switch position thereof or alternatively to said first terminal of said splitter in a second switch position thereof, the other end of said third matching network being connected to said second terminal of said splitter and said third terminal of said splitter being connectable to said predetermined electrical impedance.

* * * * *